(12) United States Patent
Byeon et al.

(10) Patent No.: US 7,545,203 B2
(45) Date of Patent: Jun. 9, 2009

(54) INTERNAL VOLTAGE GENERATION CIRCUIT

(75) Inventors: Sang-Jin Byeon, Kyoungki-do (KR); Seok-Cheol Yoon, Kyoungki-do (KR)

(73) Assignee: Hynix Semiconductor, Inc., Gyeonggi-do (KR)

( * ) Notice: Subject to any disclaimer, the term of this patent is extended or adjusted under 35 U.S.C. 154(b) by 97 days.

(21) Appl. No.: 11/526,818

(22) Filed: Sep. 26, 2006

(65) Prior Publication Data

US 2007/0147140 A1    Jun. 28, 2007

(30) Foreign Application Priority Data

Sep. 29, 2005   (KR) ................ 10-2005-0091668
Dec. 28, 2005   (KR) ................ 10-2005-0132495

(51) Int. Cl.
  *G05F 1/46*    (2006.01)
  *H02M 3/07*   (2006.01)

(52) U.S. Cl. ............. 327/536; 327/537; 327/541; 363/60

(58) Field of Classification Search ........... None
See application file for complete search history.

(56) References Cited

U.S. PATENT DOCUMENTS 5,396,114 A * 3/1995 Lee et al. .................. 327/535
5,889,664 A * 3/1999 Oh .......................... 363/60
6,002,599 A  12/1999 Chow
6,201,437 B1 * 3/2001 Kono et al. ............... 327/545
6,373,326 B1 * 4/2002 Tomari ..................... 327/536
6,519,191 B1  2/2003 Morishita
2005/0141319 A1  6/2005 Jang

FOREIGN PATENT DOCUMENTS

JP    2003-091991 A    3/2003
KR    2001-0059291     7/2001

OTHER PUBLICATIONS

Taiwanese Office Action and Search Report, w/English translation thereof, issued in Taiwanese Patent Application No. 095136307 dated on Sep. 26, 2008.

* cited by examiner

*Primary Examiner*—Lincoln Donovan
*Assistant Examiner*—Terry L Englund
(74) *Attorney, Agent, or Firm*—Mannava & Kang P.C.

(57) ABSTRACT

An inter voltage generation circuit includes a pumping voltage generator to generate a pumping voltage, a level comparator to compare the pumping voltage level with a peripheral voltage level and output an enable signal depending on the comparison result, and a peripheral voltage generator to output a pumping enable signal according to the enable signal and generate a peripheral voltage according to the enable signal.

19 Claims, 8 Drawing Sheets

INTERNAL VOLTAGE GENERATION CIRCUIT

FIELD OF THE INVENTION

The present invention relates to an internal voltage generation circuit, and more particularly, to an internal voltage generation circuit that can reduce a latch-up event, wherein the internal voltage generation circuit generates a pumping voltage using an external power supply voltage and a back-bias voltage using a ground voltage, wherein the pumping voltage has a voltage level greater than the external power supply voltage, and the back-bias voltage having a voltage level less than the ground voltage.

DESCRIPTION OF RELATED ARTS

Generally, semiconductor memory devices such as dynamic random access memories (DRAMs) generate an internal voltage having various voltage levels using an external voltage. DRAMs use the internal voltage for various operations. There are two methods of generating an internal voltage using an external voltage. One method relates to a down conversion of an external voltage into an internal voltage having a voltage level less than that of the external voltage. The other method relates to generation of an internal voltage having a voltage level greater than that of the external voltage or less than that of a ground voltage by using a charge pump.

The internal voltage generated through the down-conversion can reduce power consumption. The internal voltage generated through the charge pumping activity can be used for many purposes.

In more detail, in DRAMs, a pumping voltage VPP and a back-bias voltage VBB are typical internal voltage types commonly used for the charge pumping activity. The pumping voltage VPP, which has a voltage level greater than that of an external power supply voltage VCC, is supplied to gates or word lines of cell transistors, and this supply of the pumping voltage VPP reduces the loss of cell data commonly occurring during data transmission. The back-bias voltage VBB, which has a voltage level less than that of a ground voltage VSS, is supplied to a bulk of cell transistors in order to reduce the loss of cell data.

The efficiency of a charge pump affects the generation of the pumping voltage VPP and the back-bias voltage VBB. Thus, it is necessary to implement the highly efficient charge pump in a small or the same area of the chip. Recently, as the power supply voltage is reduced to 1.5 V or lower, the internal voltage down converted from the power supply voltage can have insufficient voltage levels to stably operate semiconductor memory devices.

For instance, when a pull-up voltage that is the same as or lower than the power supply voltage is used to control gates of bit line equalizing transistors that equalize bit line pairs (i.e., BL and /BL) of bit line sense amplifiers, the bit line pairs (i.e., BL and /BL) are not equalized appropriately.

Also, a precharge operation cannot be carried out appropriately when the pull-up voltage that is same as or lower than the power supply voltage level is applied to control transistors that precharge voltage levels of pull-up transistors (RTO) and pull-down transistors (SB) to a bit line precharge voltage VBLP level during a sense amplification operation prior to operating the pull-up transistors and the pull-down transistors.

In addition, the precharge operation cannot be carried out appropriately when the pull-up voltage that is same as or lower than the power supply voltage level is applied to control gates of transistors that precharge local input/output lines and global input/output lines.

In other words, characteristics of N-type channel metal-oxide semiconductor (NMOS) transistors usually make it difficult to transfer a high voltage level to a target circuit. Thus, in the case that a voltage is supplied from a source to a drain when a gate voltage level is not greater than a drain voltage level by a threshold voltage value, the drain voltage level decreases by the threshold voltage value from the source voltage level.

As one exemplary recovery approach for the above described limitation, an internal voltage generation circuit using a charge pump is introduced as illustrated in FIG. 1. The internal voltage generation circuit includes a VPP level detector 10, a ring oscillator 11, a pump control logic block 12, a tripler charge pump 13, and a VPERI driver 14. The VPP level detector 10 detects a pumping voltage VPP level based on a reference voltage VREFPP and outputs a pumping enable signal PPE. The ring oscillator 11 generates a periodic signal OSC according to the pumping enable signal PPE. The pump control logic block 12 generates a pumping control signal to control a charge pump (e.g., the tripler charge pump 13) according to the periodic signal OSC. The tripler charge pump 13 generates the pumping voltage VPP according to the pumping control signal and outputs the pumping voltage VPP to the VPP level detector 10 and the VPERI driver 14. The VPERI driver 14 outputs a peripheral voltage VPERI using the pumping voltage VPP.

The conventional internal voltage generation circuit down converts again the internally generated pumping voltage VPP that is charge pumped to a voltage level greater than an external voltage level and generates the peripheral voltage VPERI that is higher than the external voltage but lower than the internal pumping voltage VPP.

However, the internal voltage generation circuit has low charge pumping efficiency, and thus, a large amount of current is dissipated during the generation of the pumping voltage VPP. Additionally, the down-conversion causes current dissipation. Thus, the doubly dissipated amounts of current may limit an efficient reduction in current dissipation.

As illustrated in FIG. 2, another internal voltage generation circuit is introduced to reduce the power consumption. The internal voltage generation circuit illustrated in FIG. 2 includes a separate charge pump to generate the peripheral voltage VPERI.

A peripheral voltage VPERI generator includes a VPERI level detector 20, a separate ring oscillator 21, a separate pump control logic block 22, and a doubler charge pump 23. The VPERI level detector 20 detects a level of the peripheral voltage VPERI according to a reference voltage VREFP and outputs a pumping enable signal PE. The separate ring oscillator 21 generates another periodic signal OSC1 according to the pumping enable signal PE. The separate pump control logic block 22 generates another pumping control signal to control a charge pump (e.g., the doubler charge pump 23) according to the other periodic signal OSC1. The doubler charge pump 23 generates the peripheral voltage VPERI according to the other pumping control signal and outputs the peripheral voltage VPERI to the VPERI level detector 20.

The internal voltage generation circuit illustrated in FIG. 2 is more advantageous than the internal voltage generation circuit illustrated in FIG. 1. For instance, comparing the case that a pumping voltage VPP of 3.0 V is generated using the tripler charge pump 13 with the case that a peripheral voltage VPERI is generated using the doubler charge pump 23, the pumping voltage VPP has a pumping efficiency of 20%.

Based on this estimated pumping efficiency, a current of 40 mA is required to generate a pumping current of 100 mA. Since the pumping efficiency of the peripheral voltage VPERI is generally 30%, a current of 33 mA is required to generate a peripheral current of 10 mA.

However, the internal voltage generation circuit illustrated in FIG. 2 uses the separate charge pumps to generate the pumping voltage VPP and the peripheral voltage VPERI. Thus, if the peripheral voltage VPERI is generated prior to generating the pumping voltage VPP during an initial operation stage, a latch-up event is more likely to occur due to a voltage difference between the pumping voltage VPP and the peripheral voltage VPERI.

More specifically, a target level of the pumping voltage VPP is greater than that of the peripheral voltage VPERI. The pumping voltage VPP is used for various operations such as word line biasing operation and well pick-up operation. Thus, the pumping voltage VPP reaches the target level more slowly than the peripheral voltage VPERI having a storage capacitor and a parasitic capacitor that are smaller than those of the pumping voltage VPP.

In this case, triggered parasitic PNP and NPN transistors P1 and N1 may cause a latch-up event in complementary metal-oxide semiconductor (CMOS) inverters illustrated in FIGS. 3A and 3B. The triggered parasitic PNP transistor often allows current to flow from a peripheral voltage VPERI terminal to a pumping voltage VPP terminal. Therefore, semiconductor memory devices may operate erroneously due to these parasitic transistors.

SUMMARY OF THE INVENTION

It is, therefore, an object of the present invention to provide an internal voltage generation circuit that can reduce a latch-up event, which generally occurs during generation of different internal voltages with different target voltage levels, by adjusting a period to operate a charge pump.

In accordance with an aspect of the present invention, there is provided an inter voltage generation circuit including: a pumping voltage generator to generate a pumping voltage; a level comparator to compare the pumping voltage level with a peripheral voltage level and output an enable signal depending on the comparison result; and a peripheral voltage generator to output a pumping enable signal according to the enable signal and generate a peripheral voltage according to the enable signal.

BRIEF DESCRIPTION OF THE DRAWINGS

The above and other objects and features of the present invention will become better understood with respect to the following description of the exemplary embodiments given in conjunction with the accompanying drawings, in which.

DETAILED DESCRIPTION OF THE INVENTION

An internal voltage generation circuit in accordance with various embodiments of the present invention will be described in detail with reference to the accompanying drawings.

Figure 1:
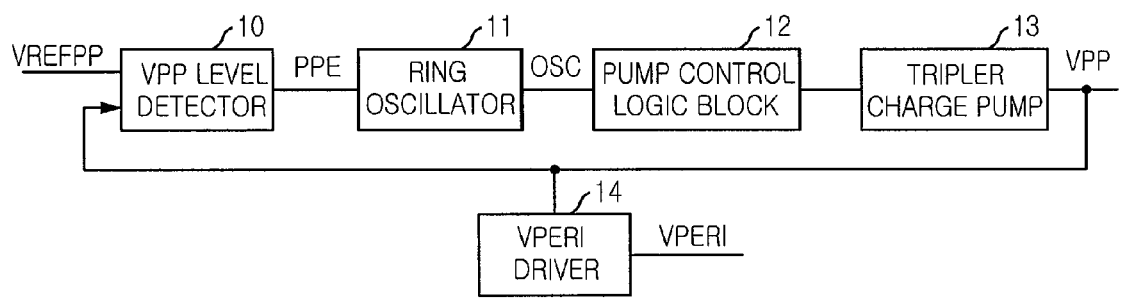
FIG. 1 is a block diagram of a typical internal voltage generation circuit.
Figure 2:
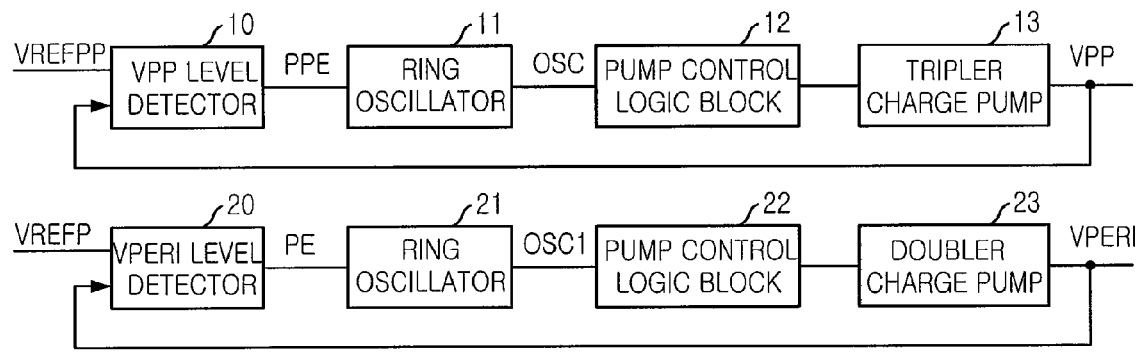
FIG. 2 is a block diagram of another typical internal voltage generation circuit.
Figure 3A:
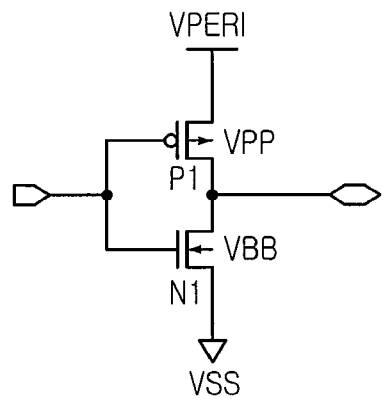
FIGS. 3A and 3B are circuit diagrams to describe limitations associated with the typical internal voltage generation circuits.
Figure 3B:
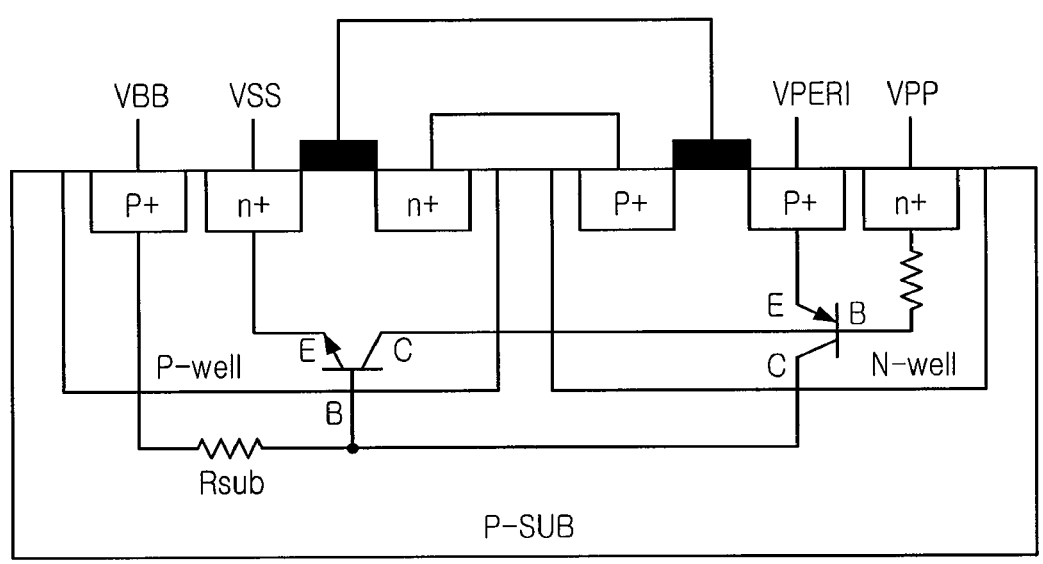
Figure 4:
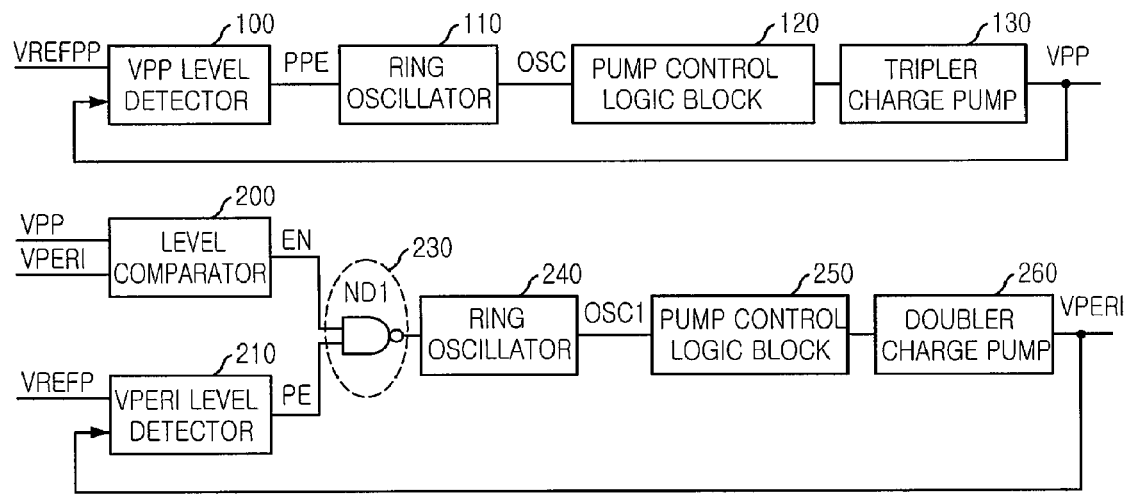
FIG. 4 is an internal voltage generation circuit in accordance with an embodiment of the present invention.

FIG. 4 is a circuit diagram of an internal voltage generation circuit in accordance with an embodiment of the present invention.

The internal voltage generation circuit includes a VPP level detector 100, a first ring oscillator 110, a first pump control logic block 120, a tripler charge pump 130, a level comparator 200, a VPERI level detector 210, a logic operator 230, a second ring oscillator 240, a second pump control logic block 250, and a doubler charge pump 260.

The VPP level detector 100 detects a pumping voltage VPP level according to a first reference voltage VREFPP and outputs a pumping enable signal PPE. The first ring oscillator 110 generates a periodic signal OSC according to the pumping enable signal PPE. The first pump control logic block 120 generates a pumping control signal to control the tripler charge pump 130 according to the periodic signal OSC. The tripler charge pump 130 generates the pumping voltage VPP according to the pumping control signal and outputs the pumping signal OSC to the VPP level detector 100 and the level comparator 200.

The level comparator 200 compares the pumping voltage VPP with a peripheral voltage VPERI and outputs an enable signal EN. The VPERI level detector 210 detects a peripheral voltage VPERI level according to a second reference voltage VREFP and outputs another pumping enable signal PE. The logic operator 230 includes an NAND gate ND1 that performs an NAND operation on the enable signal EN and the other pumping enable signal PE.

The second ring oscillator 240 generates another periodic signal OSC1 according to an output of the logic operator 230. The second pump control logic block 250 generates another pump control signal to control the doubler charge pump 260 according to the other periodic signal OSC1. The doubler charge pump 260 generates the peripheral voltage VPERI according to the other pumping control signal and outputs the peripheral voltage VPERI to the VPERI level detector 210 and the level comparator 200.

Figure 5:
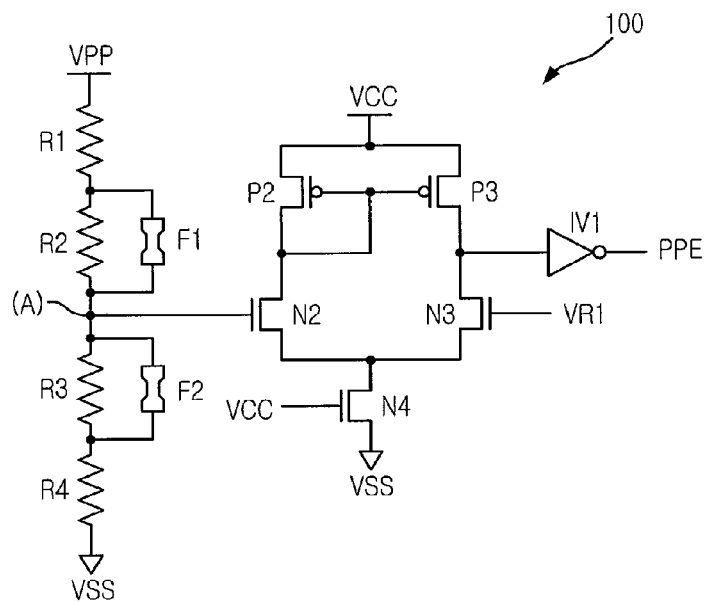
FIG. 5 is a detailed circuit diagram of a VPP level detector illustrated in FIG. 4.

FIG. 5 is an exemplary circuit diagram of the VPP level detector 100 illustrated in FIG. 4.

The VPP level detector 100 includes resistors R1 to R4, fuses F1 and F2, P-type channel metal-oxide semiconductor (PMOS) transistors P2 and P3, N-type channel metal-oxide semiconductor (NMOS) transistors N2 to N4, and an inverter IV1. The VPP level detector 100 receives the pumping voltage VPP, compares a reference voltage VR1 and a voltage level of a common node A, and outputs the pumping enable signal PPE.

More specifically, if a pumping voltage VPP level is reduced to a target voltage level, a voltage level of the common node A is less than the reference voltage VR1 level. As a result, the pumping enable signal PPE has a logic high level. On the other hand, if the pumping voltage VPP level is the same as or greater than the target voltage level, a voltage level of the voltage level detector 100 is greater than the reference voltage VR1 level. As a result, the pumping enable signal PPE has a logic low level.

When the target voltage level of the pumping voltage VPP needs to be increased or decreased, the fuses F1 and F2 are cut to adjust a ratio of resistance of the resistors R1 to R4. The above pumping voltage VPP generation circuit can stably and effectively run operations, consuming less current when the VPP level detector 100 has a good response characteristic.

Figure 6:
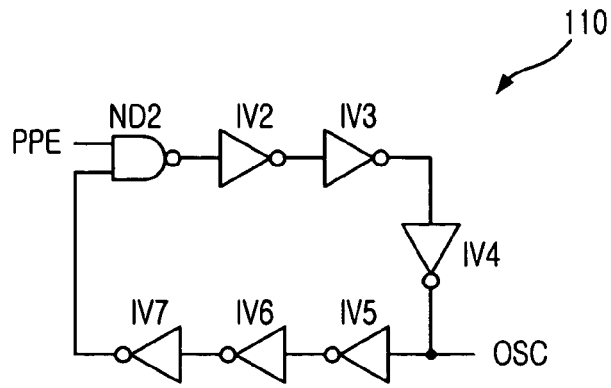
FIG. 6 is a detailed circuit diagram of a first ring oscillator illustrated in FIG. 4.

FIG. 6 is a detailed circuit diagram of the first ring oscillator 110 of FIG. 4.

The first ring oscillator 110 includes an NAND gate ND2 and multiple inverters IV2 to IV7. When the pumping enable signal PPE is logically high, the first ring oscillator 110 generates the periodic signal OSC.

Figure 7:
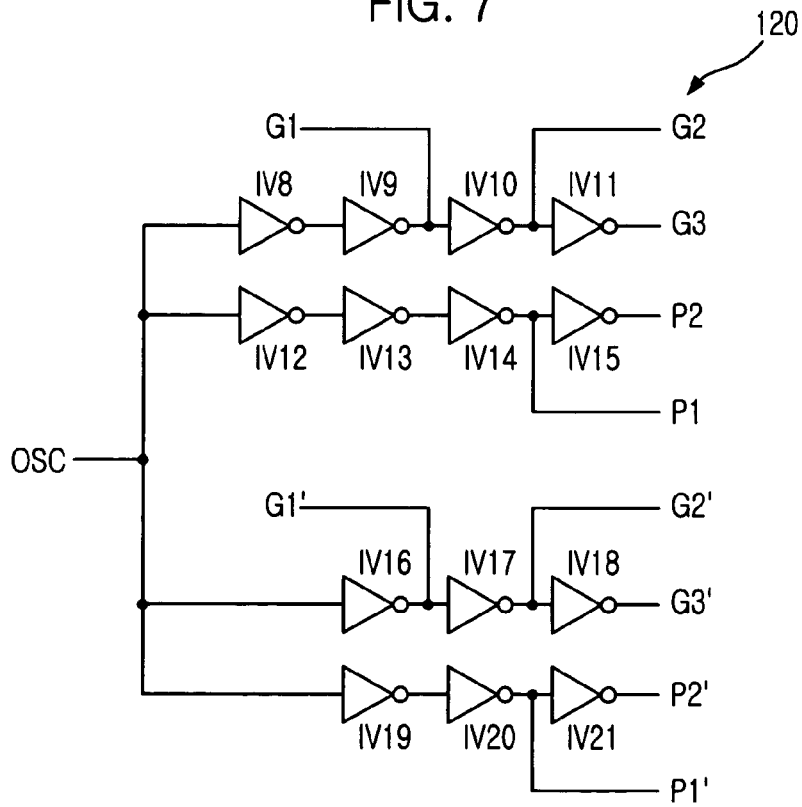
FIG. 7 is a detailed circuit diagram of a first pump control logic block illustrated in FIG. 4.
Figure 8:
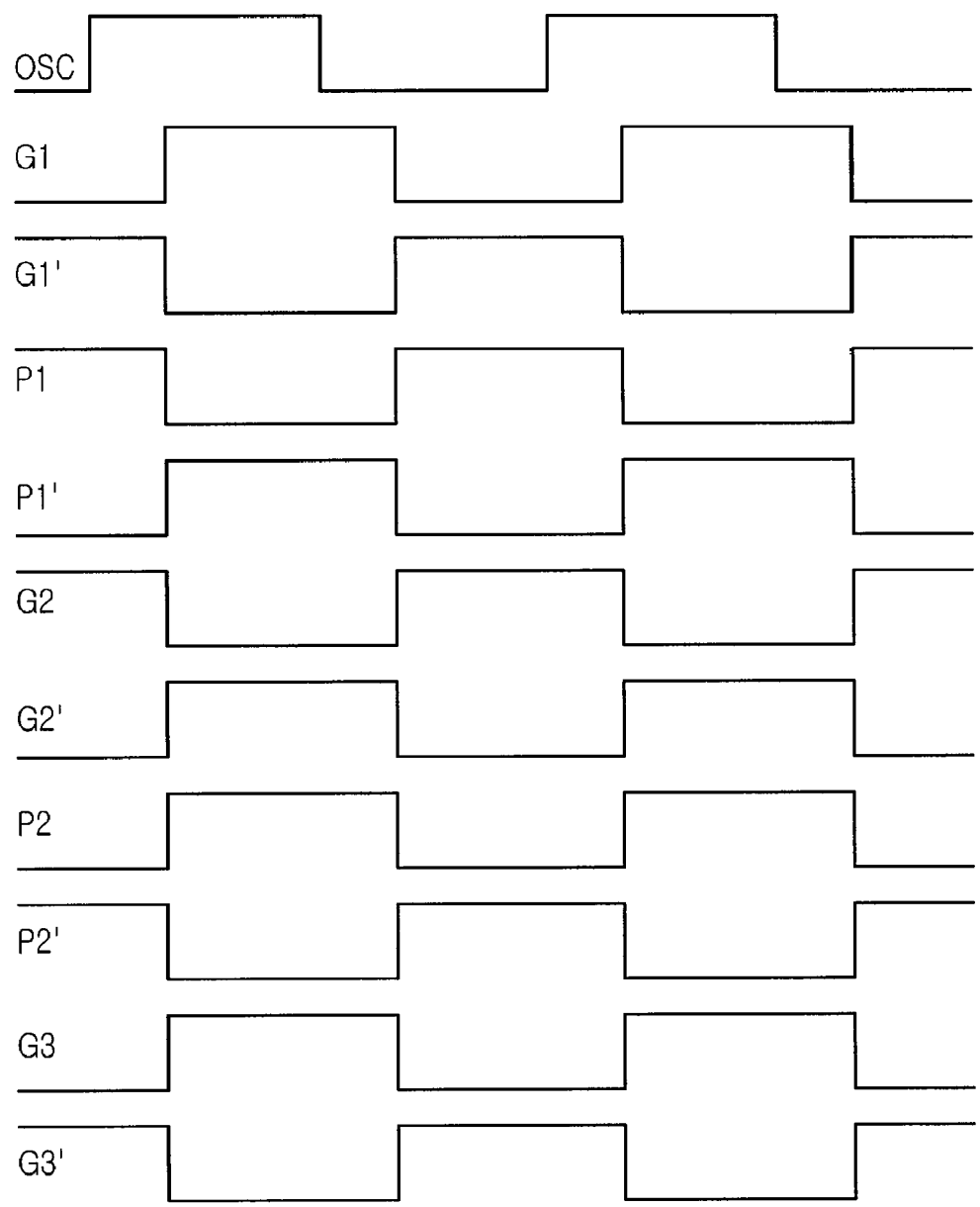
FIG. 8 is an operation waveform generated by the first pump control logic block illustrated in FIG. 7.

FIG. 7 is a circuit diagram of the first pump control logic block 120 illustrated in FIG. 4. FIG. 8 illustrates an operation waveform associated with the first pump control logic block 120 illustrated in FIG. 4.

The first pump control logic block 120 includes multiple inverters IV8 to IV21. According to the periodic signal OSC, the first pump control logic block 120 generate pumping control signals P1, P2, G1, G2, G3, P1', P2', G1', G2', and G3'. A group of the pumping control signals P1, P2, G1, G2, and G3 and another group of the pumping control signals P1', P2', G1', G2', and G3' are activated or inactivated according to the timing at which these pumping control signals P1, P2, G1, G2, G3, P1', P2', G1', G2', and G3' transit at the same time but with an opposite phase. These two groups of the pumping control signals P1, P2, G1, G2, G3, P1', P2', G1', G2', and G3' are input to the tripler charge pump 130 based on the timing operation illustrated FIG. 8. In response to the two groups of the pumping control signals P1, P2, G1, G2, G3, P1', P2', G1', G2', and G3', the pumping voltage VPP that is triply amplified is generated at the tripler charge pump 130. When the pumping voltage VPP reaches a target voltage level by continuously running the pumping operation of the tripler charge pump 130, the VPP level detector 100 detects the target voltage level and outputs the pumping enable signal PPE that is in a logic low state. As a result, the tripler charg pump 130 stops the pumping operation.

Figure 9A:
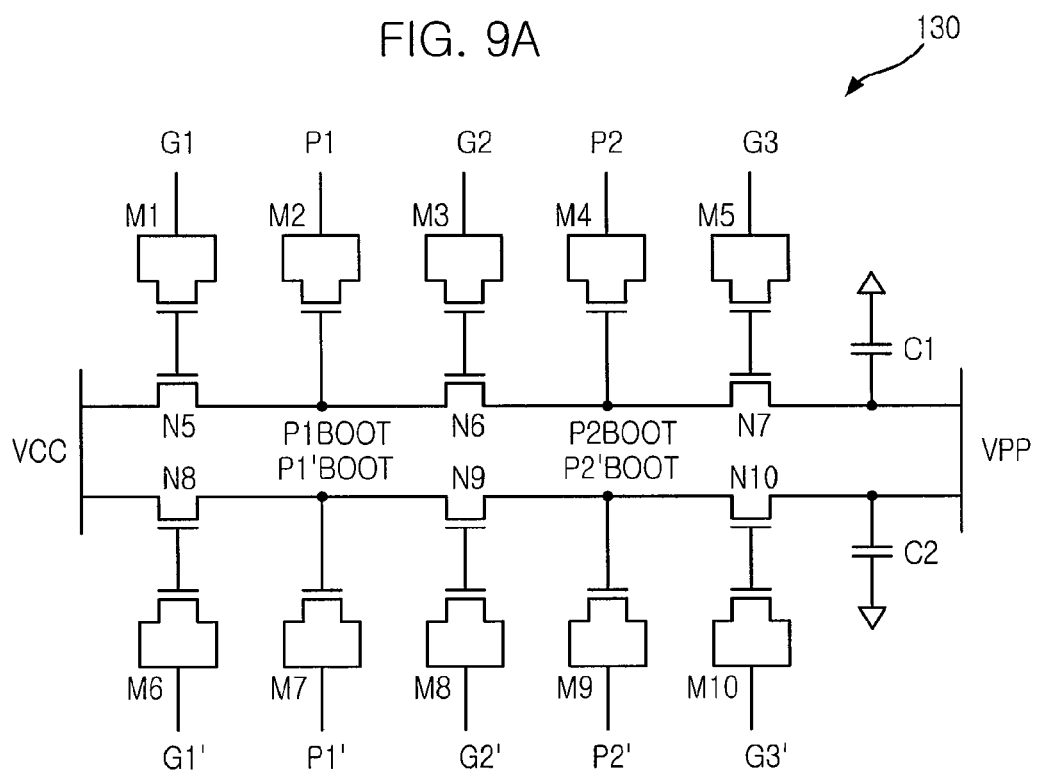
FIGS. 9A and 9B are exemplary circuit diagrams of a tripler charge pump illustrated in FIG. 4.
Figure 9B:
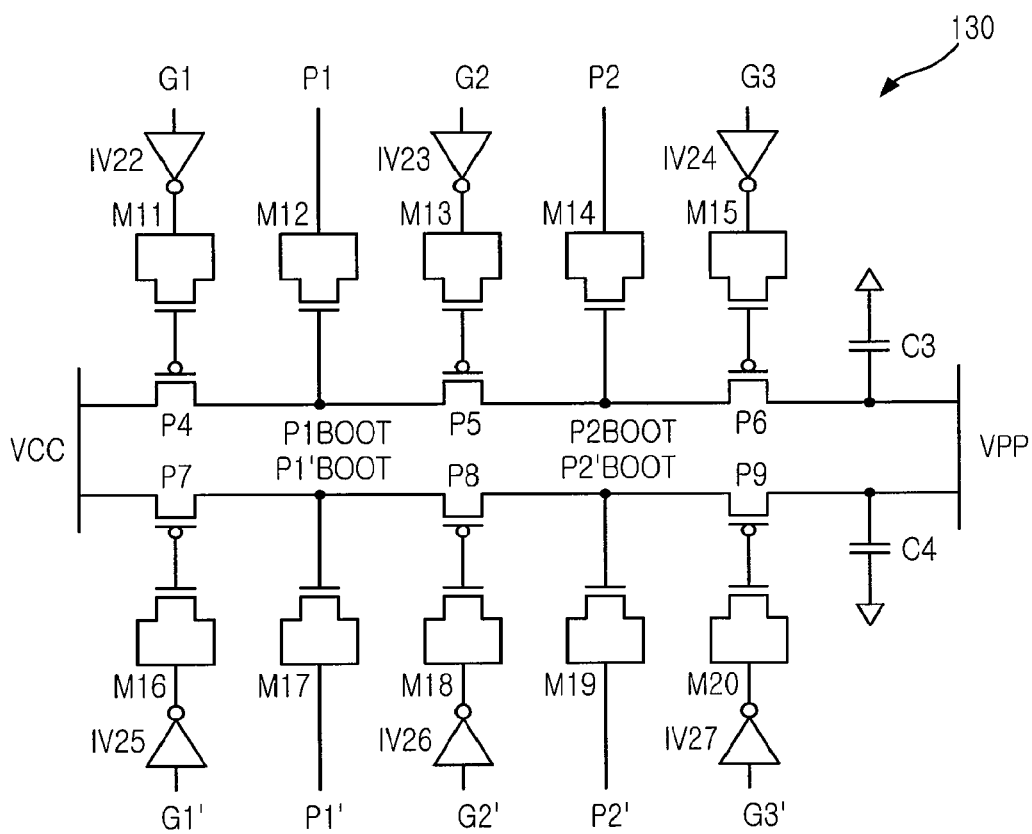

FIGS. 9A and 9B illustrate detailed exemplary circuit diagrams of the tripler charge pump 130 illustrated in FIG. 4.

Referring to FIG. 9A, the tripler charge pump 130 includes NMOS transistors N5 to N10, MOS capacitors M1 to M10, and capacitors C1 and C2. Referring to FIG. 9B, the tripler charge pump 130 includes PMOS transistors P4 to P9, MOS capacitors M11 to M20, inverters IV22 to IV27, and capacitors C3 and C4.

Figure 10A:
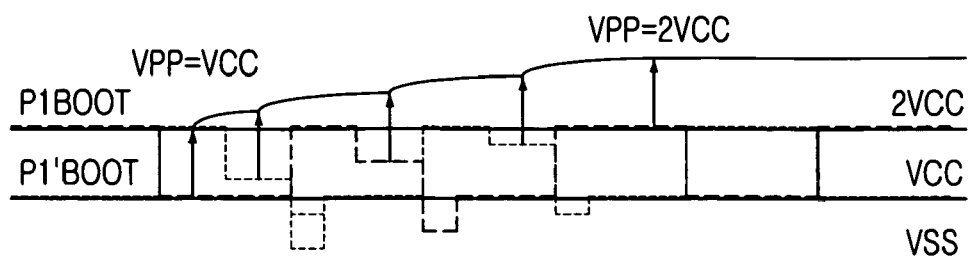
FIGS. 10A and 10B are operation waveforms generated by the tripler charge pump illustrated in FIG. 4.
Figure 10A:
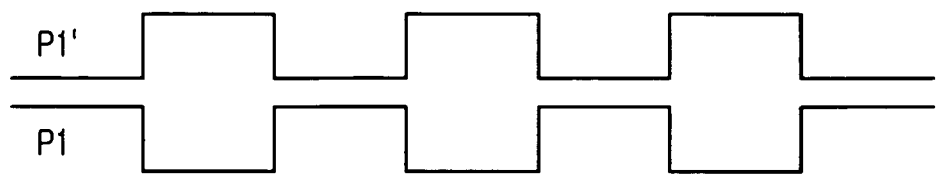
Figure 10B:
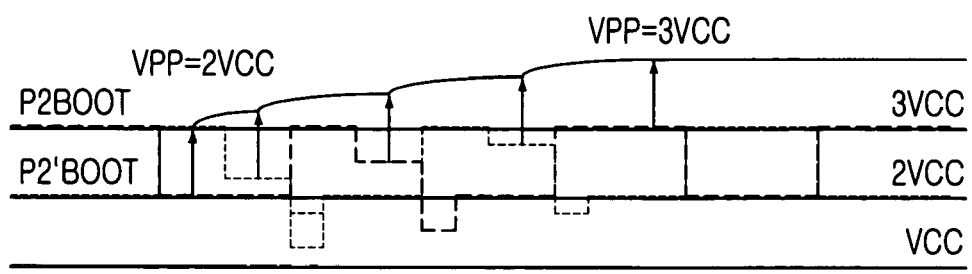
Figure 10B:
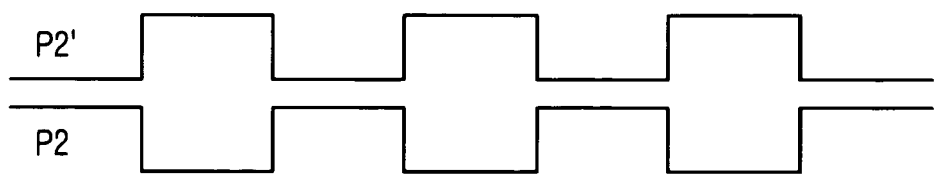

FIGS. 10A and 10B are exemplary operation waveforms generated by the tripler charge pumps 130 illustrated in FIGS. 9A and 9B, respectively.

When the pumping control signal G1 transits from a ground voltage VSS level to a power supply voltage VCC level, the NMOS transistor N5 turns on. At this time, when the pumping control signal P1 transits from the power supply voltage VCC level to the ground voltage VSS level, a bootstrapping node P1BOOT has the power supply voltage VCC level.

When the pumping control signal G1 transits from the power supply voltage VCC level to the ground voltage VSS level, the NMOS transistor N5 turns off. When the pumping control signal P1 transits to the power supply voltage VCC level from the ground voltage VSS level, a voltage level of the bootstrapping node P1BOOT becomes twice the power supply voltage level (i.e., 2VCC). The pumping control signal G2 transits from the ground voltage VSS level to the power supply voltage VCC level, and thus, the NMOS transistor N6 turns on.

When the pumping control signal P2 transits from the power supply voltage VCC level to the ground voltage VSS level, a bootstrapping node P2BOOT has a negative power supply voltage –VCC level. Afterwards, the bootstrapping node P2BOOT is precharged with the bootstrapping node P1BOOT to thereby have the power supply voltage VCC level. When the pumping control signal G2 transits from the power supply voltage VCC level to the ground voltage VSS level, the NMOS transistor N6 turns off, and the pumping control signal P2 transits from the ground voltage VSS level to the power supply voltage VCC level. As a result, the bootstrapping node P2BOOT has a voltage level that is twice the power supply voltage VCC level (i.e., 2VCC).

When the pumping control signal G3 transits from the ground voltage VSS level to the power supply voltage VCC level, the NMOS transistor N7 turns on. As a result, the pumping voltage VPP is generated by a voltage of the bootstrapping node P2BOOT that has a voltage level twice the power supply voltage VCC level. Due to the above-described operation, the bootstrapping node P1BOOT reaches a voltage level that is twice the power supply voltage VCC level, i.e., 2VCC. The bootstrapping node P2BOOT reaches a voltage level that is triple the power supply voltage VCC level, i.e., 3VCC. The pumping control signals P1', P2', G1', G2', and G3' are input to the tripler charge pump 130 with phases opposite to the phases of the pumping control signals P1, P2, G1, G2, and G3. That is, the tripler charge pump 130 supplies charges alternately to a pumping voltage VPP terminal through a pumping voltage generation path.

The bootstrapping node P1BOOT of the tripler charge pump 130 has a precharge level equal to the power supply voltage VCC level, while the bootstrapping node P2BOOT of the tripler charge pump 130 has a precharge level that is twice the power supply voltage VCC level. The bootstrapping node P1BOOT has a maximum pumping level that is twice the power supply voltage VCC level, i.e., 2VCC, and the bootstrapping node P2BOOT has a maximum pumping level that is triple the power supply voltage VCC level, i.e., 3VCC.

More specifically, the bootstrapping node P1BOOT and a bootstrapping node P1'BOOT are bootstrapped to a maximum voltage level that is twice the power supply voltage VCC level (i.e., 2VCC). The bootstrapping node P2BOOT and a bootstrapping node P2'BOOT are bootstrapped to a maximum voltage level that is triple the power supply voltage VCC level (i.e., 3VCC). Consequently, the voltages of the bootstrapping nodes P2BOOT and P2'BOOt are transferred to the terminal of the pumping voltage VPP.

The current efficiency of the tripler charge pump 130 can be calculated as follows.

$$\text{Efficiency} = ((3VCC - VPP) * C / 3VCC * C) * 100 \qquad \text{Eq. 1}$$

Hypothetically, the maximum pumping voltage VPP level is triple the power supply voltage VCC level. In the above equation 1, C is the electric capacitance of the bootstrapping nodes P1BOOT and P1'BOOT. For instance, if the power supply voltage VCC is approximately 1.5 V and a target voltage level of the pumping voltage VPP is approximately 3.5 V, the current efficiency is approximately 22%. The hypothetical maximum pumping voltage VPP level is approximately 4.5 V. The current efficiency is obtained by dividing an amount of charge stored on the pumping voltage VPP terminal by an amount of charge supply from the power supply voltage VDD terminal.

Figure 11:
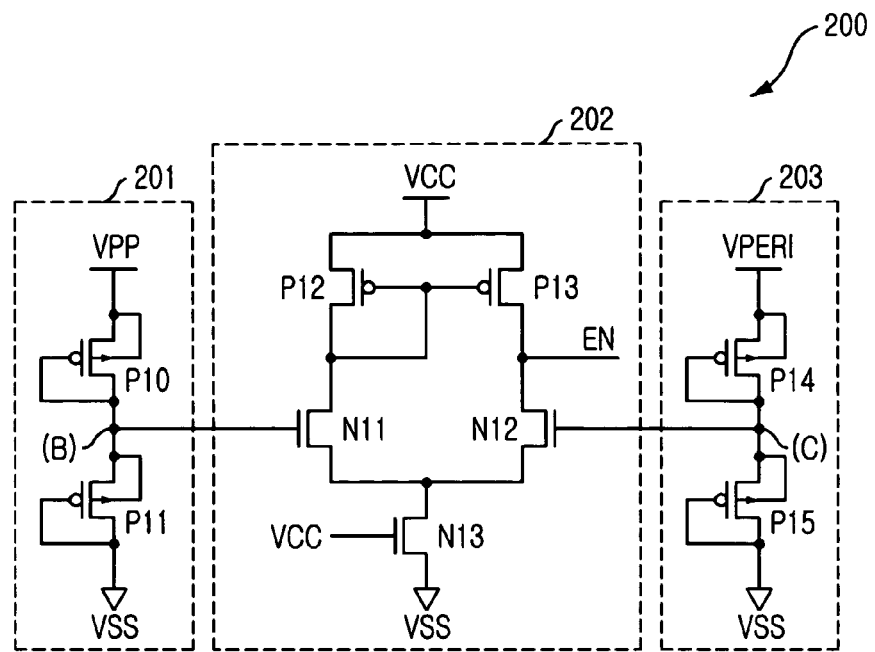
FIG. 11 is an exemplary detailed circuit diagram of a level comparator illustrated in FIG. 4.

FIG. 11 is one exemplary circuit diagram of the level comparator 200 illustrated in FIG. 4.

The level comparator 200 includes a pumping voltage control unit 201, a comparison unit 202 and a peripheral voltage unit 203. The pumping voltage control unit 201 includes PMOS transistors P10 and P11. The PMOS transistors P10 and P11 are coupled in series between a pumping voltage VPP terminal and a ground voltage terminal. A gate terminal of each of the PMOS transistors P10 and P11 is coupled with one terminal, and a bulk of each of the PMOS transistors P10 and P11 is coupled to the other respective terminal thereof.

The comparison unit 202 includes PMOS transistors P12 and P13 and NMOS transistors N11 to N13. The PMOS transistors P12 and P13 form a current mirror structure. The PMOS transistors P12 and P13 receive the power supply voltage VCC through one common terminal, and a common gate terminal of the PMOS transistors P12 and P13 is coupled to the other terminal of the PMOS transistor P12. The comparison unit 202 may include a differential amplifier.

The NMOS transistor N11 is coupled between the PMOS transistor P12 and the NMOS transistor N13 and receives an output of the pumping voltage control unit 201 through a gate terminal of the NMOS transistor N11. The NMOS transistor N12 is coupled between the PMOS transistor P13 and the NMOS transistor N13 and receives an output of the peripheral voltage control unit 203 through a gate terminal of the NMOS transistor N12. The enable signal EN is output through one common terminal between the PMOS transistor P13 and the NMOS transistor N12.

The peripheral voltage control unit 203 includes PMOS transistors P14 and P15. The PMOS transistors P14 and P15 are coupled in series between a peripheral voltage VPERI terminal and the ground voltage terminal. A gate terminal of each of the PMOS transistors P14 and P15 is coupled with one terminal, and a bulk of each of the PMOS transistors P14 and P15 is coupled to the other respective terminal thereof.

Due to the pumping voltage control unit 201 and the peripheral voltage control unit 203, a voltage level of a node B is approximately ⅓ of the pumping voltage VPP level, and a voltage level of a node C is approximately ⅓ of the peripheral voltage VPERI level.

The level comparator 200 compares the pumping voltage VPP level with the peripheral voltage VPERI level. If the pumping voltage VPP level is greater than the peripheral voltage VPERI level, the output enable signal EN is in a logic high state. If the pumping voltage VPP level is less than the peripheral voltage VPERI level, the output enable signal EN is in a logic low state.

The logic operator 230 performs an NAND operation on the enable signal EN and the other pumping enable signal PE output from the VPERI level detector 210 to adjust a time to operate the second ring oscillator 240, the second pump control logic block 250 and the doubler charge pump 260. In this case, the peripheral voltage pump operates when the peripheral voltage VPERI level is less than the pumping voltage VPP level. As a result, a latch-up event does not occur.

The second ring oscillator 240 generates the other periodic signal OSC1 in response to an output of the logic operator 230. The second pump control logic block 250 generates a pumping control signal to control the doubler charge pump 260 according to the other periodic signal OSC 1. The doubler charge pump 260 generates the peripheral voltage VPERI according to the pumping control signal and outputs the peripheral voltage VPERI to the VPERI level detector 210 and the level comparator 200.

The VPERI level detector 210, the second ring oscillator 240, the second pump control logic block 250, and the doubler charge pump 260 have substantially the same configuration as the VPP level detector 100, the first ring oscillator 110, the first pump logic block 120, and the tripler charge pump 130. Thus, detailed description thereof will be omitted. However, the difference exists in that the input and output signals of the VPERI level detector 210, the second ring oscillator 240, the second pump logic block 250, and the doubler charge pump 260 are related to the peripheral voltage VPERI.

Figure 12:
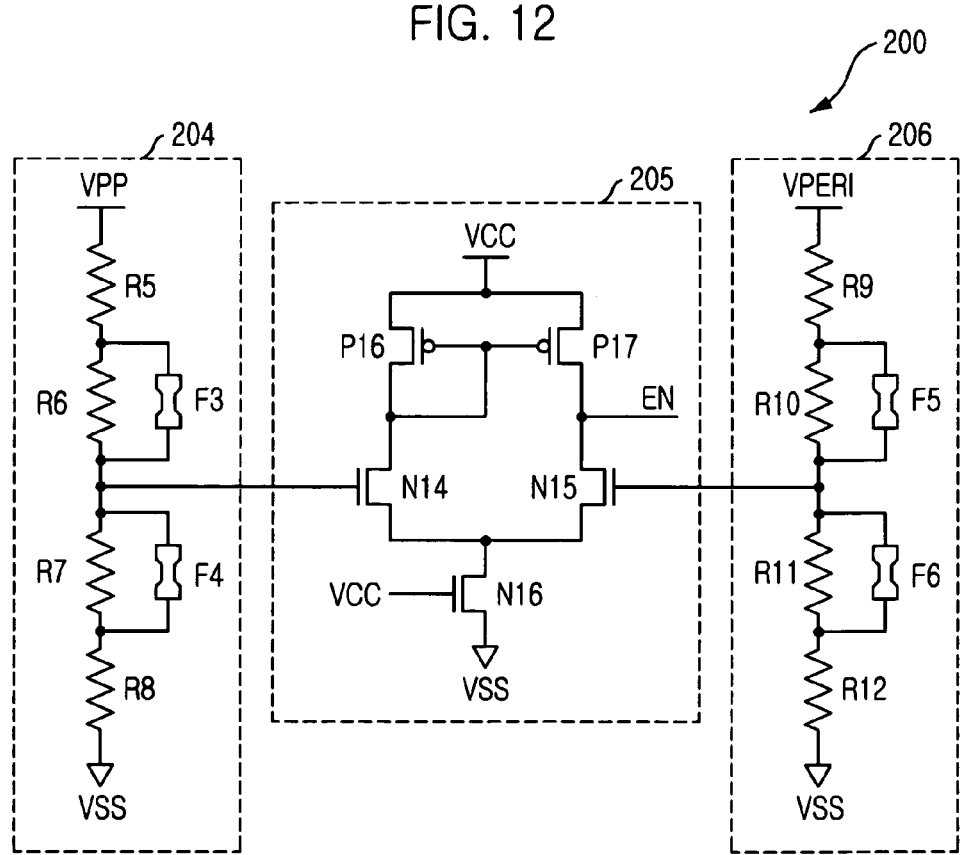
FIG. 12 is another exemplary detailed circuit diagram of the level comparator illustrated in FIG. 4.

FIG. 12 is another exemplary circuit diagram of the level comparator 200 illustrated in FIG. 4.

The level comparator 200 includes a pumping voltage control unit 204, a comparison unit 205 and a peripheral voltage control unit 206. The pumping voltage control unit 204 includes a plurality of resistors R5 to R8 and fuses F3 and F4. The resistors R5 to R8 are coupled in series between a pumping voltage VPP terminal and a ground voltage terminal. The fuses F3 and F4 are coupled respectively with the resistors R6 and R7 in parallel.

The comparison unit 205 includes PMOS transistors P16 and P17 and NMOS transistors N14 to N16. The PMOS transistors P16 and P17 are supplied with the power supply voltage VCC through one common terminal, and a common gate terminal of the PMOS transistors P16 and P17 is coupled to the other terminal of the PMOS transistor P16.

The NMOS transistor N14 is coupled between the PMOS transistor P16 and the NMOS transistor N16 and receives an output of the pumping voltage control unit 204 through a gate terminal of the NMOS transistor N14. The NMOS transistor N15 is coupled between the PMOS transistor P17 and the NMOS transistor N16 and receives an output of the peripheral voltage control unit 206 through a gate terminal of the NMOS transistor N15. The enable signal EN is output through one common terminal between the PMOS transistor P17 and the NMOS transistor N15.

The peripheral voltage control unit 206 includes a plurality of resistors R9 to R12 and fuses F5 and F6. The resistors R9 to R12 are coupled in series between a peripheral voltage VPERI terminal and the ground voltage terminal. The fuses F5 and F6 are coupled with the resistors R10 and R11 in parallel.

As illustrated, the level comparator 200 illustrated in FIG. 12 comprises a plurality of resistors to divide the pumping voltage VPP and the peripheral voltage VPERI.

The level comparator 200 includes a reservoir capacitor for the peripheral voltage VPERI larger than the reservoir capacitor for the pumping voltage VPP, and can compare a difference between voltages that are individually supplied to the aforementioned two reservoir capacitors.

Although the tripler charge pump is embodied as the charge pump in the above-described embodiments, the present invention should not be construed as being limited to these embodiments; rather, the tripler charge pump or the doubler charge pump may be selectively embodied as the charge pump depending on a target level of the peripheral voltage VPERI.

For instance, when the peripheral voltage VPERI is greater than about 2.0 V, using the tripler charge pump is advantageous. When the peripheral voltage VPERI is about 2.0 V, the tripler charge pump and the double charge pump have substantially the same efficiency, and thus, both the tripler and doubler charge pumps can be used. However, the doubler charge pump is much advantageous than the tripler charge pump in respect of the area. Accordingly, the doubler charge pump is used to generate the peripheral voltage VPERI instead of the tripler charge pump.

On the basis of various embodiments, operation timing of charge pumps is adjusted when at least two different types of internal voltages with different target voltage levels are generated in the semiconductor memory device. As a result, a latch-up event can be avoided. This effect provides stability in the semiconductor memory device.

The present application contains subject matter related to the Korean patent application NOS. KR 2005-0091668 and KR 2005-0132495, filed in the Korean Patent Office respectively on Sep. 29, 2005, and on Dec. 28, 2005, the entire contents of which being incorporated herein by reference.

While the present invention has been described with respect to certain preferred embodiments, it will be apparent to those skilled in the art that various changes and modifications may be made without departing from the spirit and scope of the invention as defined in the following claims.

What is claimed is:

1. An internal voltage generation circuit for inputting an external voltage and generating an internal voltage in a semiconductor memory device, comprising:
   a pumping voltage generator to generate a pumping voltage as the internal voltage;
   a level comparator to compare a level of the pumping voltage with a level of a peripheral voltage and output an enable signal depending on the comparison result; and
   a peripheral voltage generator to generate the peripheral voltage according to the enable signal,
   wherein the peripheral voltage is less than the internal voltage and more than the external voltage, and the peripheral voltage generator generates the peripheral voltage in response to the enable signal being produced when the level of the peripheral voltage is less than the level of the pumping voltage.

2. The internal voltage generation circuit of claim 1, wherein the level comparator comprises:
   a pumping voltage control unit dividing the pumping voltage;
   a peripheral voltage control unit dividing the peripheral voltage; and
   a comparison unit comparing an output of the pumping voltage control unit with that of the peripheral voltage control unit and outputting the enable signal.

3. The internal voltage generation circuit of claim 2, wherein the pumping voltage control unit comprises a first diode and a second diode to divide the pumping voltage.

4. The internal voltage generation circuit of claim 2, wherein the pumping voltage control unit comprises a plurality of P-type channel metal-oxide semiconductor (PMOS) transistors coupled in series between a pumping voltage terminal and a ground voltage terminal, wherein a gate terminal of each of the PMOS transistors is coupled with a drain terminal of each of the corresponding PMOS transistors.

5. The internal voltage generation circuit of claim 2, wherein the pumping voltage control unit comprises a resistor divider.

6. The internal voltage generation circuit of claim 5, wherein the resistor divider comprises a plurality of resistors coupled in series between a pumping voltage terminal and a ground voltage terminal.

7. The internal voltage generation circuit of claim 6, wherein the pumping voltage control unit further comprises a plurality of fuses coupled in parallel to the respective resistors.

8. The internal voltage generation circuit of claim 2, wherein the peripheral voltage control unit comprises a first diode and a second diode to divide the peripheral voltage.

9. The internal voltage generation circuit of claim 2, wherein the peripheral voltage control unit comprises a plurality of PMOS transistors coupled in series between a peripheral voltage terminal and a ground voltage terminal, wherein a gate terminal of each of the PMOS transistors is coupled with a drain terminal of each of the corresponding PMOS transistors.

10. The internal voltage generation circuit of claim 2, wherein the peripheral voltage control unit comprises a resistor divider.

11. The internal voltage generation circuit of claim 10, wherein the resistor divider comprises a plurality of resistors coupled in series between a peripheral voltage terminal and a ground voltage terminal.

12. The internal voltage generation circuit of claim 11, wherein the peripheral voltage control unit further comprises a plurality of fuses coupled in parallel with the respective resistors.

13. The internal voltage generation circuit of claim 2, wherein the comparison unit is configured with a current mirror structure.

14. The internal voltage generation circuit of claim 2, wherein the comparison unit is configured with a differential amplifier.

15. The internal voltage generation circuit of claim 1, wherein the pumping voltage generator comprises:
   a pumping voltage level detector detecting the level of the pumping voltage based on a level of a reference voltage and outputting a pumping enable signal in accordance with the detection result;
   a ring oscillator generating a periodic signal according to the pumping enable signal;
   a pump control logic block outputting a pumping control signal to control a pumping operation according to the periodic signal; and
   a charge pump pumping a power supply the external voltage according to the pumping control signal to generate the pumping voltage.

16. The internal voltage generation circuit of claim 15, wherein the charge pump comprises a tripler charge pump.

17. The internal voltage generation circuit of claim 1, wherein the peripheral voltage generator comprises:
   a peripheral voltage level detector detecting the level of the peripheral voltage based on a level of a reference voltage and outputting a pumping enable signal in accordance with the detection result;
   a logic operator performing a logic operation on the pumping enable signal and the enable signal;
   a ring oscillator generating a periodic signal according to an output of the logic operator;
   a pump control logic block outputting a pumping control signal to control a pumping operation according to the periodic signal; and
   a charge pump generating the peripheral voltage according to the pumping control signal.

18. The internal voltage generation circuit of claim 17, wherein the charge pump comprise a doubler charge pump.

19. The internal voltage generation circuit of claim 17, wherein the logic operator comprises an NAND gate.

* * * * *